United States Patent
Andreasen et al.

(10) Patent No.: US 9,822,873 B2
(45) Date of Patent: Nov. 21, 2017

(54) GEAR ENGAGEMENT MECHANISM FOR TRANSMISSIONS AND RELATED METHODS

(71) Applicant: PACIFIC RIM ENGINEERED PRODUCTS (1987) LTD., Surrey (CA)

(72) Inventors: Kenneth Hartmann Andreasen, Delta (CA); Jonathan David Deagle, Vancouver (CA); Bradley Edward Williams, Ladner (CA)

(73) Assignee: PACIFIC RIM ENGINEERED PRODUCTS (1987) LTD., Surrey (CA)

( * ) Notice: Subject to any disclaimer, the term of this patent is extended or adjusted under 35 U.S.C. 154(b) by 230 days.

(21) Appl. No.: 14/387,530

(22) PCT Filed: Mar. 22, 2013

(86) PCT No.: PCT/CA2013/050237
§ 371 (c)(1),
(2) Date: Sep. 23, 2014

(87) PCT Pub. No.: WO2013/138942
PCT Pub. Date: Sep. 26, 2013

(65) Prior Publication Data
US 2015/0068341 A1      Mar. 12, 2015

Related U.S. Application Data

(60) Provisional application No. 61/615,007, filed on Mar. 23, 2012.

(51) Int. Cl.
  *F16H 61/28* (2006.01)
  *F16H 59/68* (2006.01)
  (Continued)

(52) U.S. Cl.
  CPC ......... *F16H 61/2807* (2013.01); *F16H 59/68* (2013.01); *F16H 61/0403* (2013.01);
  (Continued)

(58) Field of Classification Search
  None
  See application file for complete search history.

(56) References Cited

U.S. PATENT DOCUMENTS 2,943,502 A    7/1960   Perkins et al.
3,046,807 A    7/1962   Barth et al.
(Continued)

FOREIGN PATENT DOCUMENTS

EP    2362189 A2       8/2011
JP    2011013187 A     1/2011
WO    0150091 A1       7/2001

*Primary Examiner* — Edwin A Young
(74) *Attorney, Agent, or Firm* — Oyen Wiggs Green & Mutala LLP (57) ABSTRACT

A position sensor system is useful for monitoring positions of shifters in transmissions and other applications. The position sensing system has an array of magneto resistive sensors and a controller configured to determine a position of a magnet along a path by triangulation. Some embodiments are relatively insensitive to fluctuations in a distance between the sensors and the path. Also described is an actuating assembly comprising a movable cylinder and a fixed rod. The actuating assembly may be applied for moving synchronizers or the like in power transmissions.

33 Claims, 9 Drawing Sheets

(51) Int. Cl.
   *G01R 33/07* (2006.01)
   *G01R 33/09* (2006.01)
   *G01D 5/14* (2006.01)
   *F16H 61/04* (2006.01)
   *G01B 7/00* (2006.01)
   *G01D 5/12* (2006.01)

(52) U.S. Cl.
   CPC .............. *G01B 7/003* (2013.01); *G01D 5/12* (2013.01); *G01D 5/145* (2013.01); *G01R 33/07* (2013.01); *G01R 33/09* (2013.01); *F16H 2059/6807* (2013.01); *F16H 2061/283* (2013.01); *F16H 2061/2823* (2013.01); *G01B 2210/58* (2013.01); *Y10T 74/20024* (2015.01)

(56) References Cited

U.S. PATENT DOCUMENTS

| | | |
|---|---|---|
| 4,513,631 A | 4/1985 | Koivunen |
| 4,592,249 A | 6/1986 | Lehmann et al. |
| 5,119,695 A | 6/1992 | Milunas et al. |
| 5,172,602 A | 12/1992 | Jurgens et al. |
| 5,224,578 A | 7/1993 | Rheinheimer et al. |
| 5,407,042 A | 4/1995 | Fukui et al. |
| 5,407,401 A | 4/1995 | Bullmer et al. |
| 5,662,198 A | 9/1997 | Kojima et al. |
| 5,720,203 A | 2/1998 | Honda et al. |
| 5,966,989 A | 10/1999 | Reed, Jr. et al. |
| 5,997,433 A | 12/1999 | Domian et al. |
| 6,098,771 A | 8/2000 | Vu |
| 6,145,644 A | 11/2000 | Mohan et al. |
| 6,276,224 B1 | 8/2001 | Ueda et al. |
| 6,307,365 B1 | 10/2001 | Santos et al. |
| 6,319,172 B1 | 11/2001 | Steinmetz et al. |
| 6,427,550 B1 | 8/2002 | Bowen |
| 6,463,821 B1 | 10/2002 | Reed, Jr. et al. |
| 6,490,944 B1 | 12/2002 | Heinzel et al. |
| 6,554,742 B2 | 4/2003 | Milender et al. |
| 6,568,515 B2 | 5/2003 | Harries |
| 6,588,292 B2 | 7/2003 | Yamasaki et al. |
| 6,634,247 B2 | 10/2003 | Pels et al. |
| 6,638,197 B2 | 10/2003 | Ogawa et al. |
| 6,679,134 B2 | 1/2004 | Shigyo |
| 6,729,456 B2 | 5/2004 | Beneton et al. |
| 6,832,978 B2 | 12/2004 | Buchanan et al. |
| 6,883,394 B2 | 4/2005 | Koenig et al. |
| 6,889,811 B2 | 5/2005 | Ebert et al. |
| 6,949,051 B2 | 9/2005 | Katakura |
| 6,953,417 B2 | 10/2005 | Koenig |
| 7,007,656 B2 | 3/2006 | Fujino |
| 7,010,406 B2 | 3/2006 | Sah et al. |
| 7,021,445 B2 | 4/2006 | Brissenden et al. |
| 7,025,707 B2 | 4/2006 | Katakura |
| 7,044,280 B2 | 5/2006 | Budal et al. |
| 7,056,264 B2 | 6/2006 | Kupper et al. |
| 7,066,862 B2 | 6/2006 | Bothe et al. |
| 7,073,407 B2 | 7/2006 | Stefina |
| 7,080,569 B2 | 7/2006 | Preisner et al. |
| 7,080,722 B2 | 7/2006 | Vogt et al. |
| 7,082,850 B2 | 8/2006 | Hughes |
| 7,086,989 B2 | 8/2006 | Siebigteroth et al. |
| 7,121,976 B2 | 10/2006 | Sakamoto et al. |
| 7,137,495 B2 | 11/2006 | Berger et al. |
| 7,163,096 B2 | 1/2007 | Neuner |
| 7,171,867 B2 | 2/2007 | McCrary et al. |
| 7,243,565 B2 | 7/2007 | Soeda |
| 7,252,621 B2 | 8/2007 | Tanba et al. |
| 7,300,375 B2 | 11/2007 | Petrzik |
| 7,314,427 B2 | 1/2008 | Sakai et al. |
| 7,326,149 B2 | 2/2008 | Kraska et al. |
| 7,329,205 B2 | 2/2008 | Preisner et al. |
| 7,337,050 B2 | 2/2008 | Preisner |
| 7,338,408 B2 | 3/2008 | Petrzik et al. |
| 7,381,151 B2 | 6/2008 | Shim |
| 7,387,590 B2 | 6/2008 | Dreher |
| 7,409,885 B2 | 8/2008 | Krauss et al. |
| 7,416,514 B2 | 8/2008 | Dell et al. |
| 7,431,006 B2 | 10/2008 | Jankuski |
| 7,464,618 B2 | 12/2008 | Mohlmann et al. |
| 7,478,572 B2 | 1/2009 | Maten et al. |
| 7,487,864 B2 | 2/2009 | Kohlhaas et al. |
| 7,500,932 B2 | 3/2009 | Katakura et al. |
| 7,607,366 B2 | 10/2009 | Hori et al. |
| 7,610,829 B2 | 11/2009 | Shintani et al. |
| 7,621,839 B2 | 11/2009 | Jackson |
| 7,621,844 B2 | 11/2009 | Kishi |
| 7,624,658 B2 | 12/2009 | Fahland et al. |
| 7,631,740 B2 | 12/2009 | Leibbrandt et al. |
| 7,635,058 B2 | 12/2009 | Moehlmann et al. |
| 7,643,925 B2 | 1/2010 | Whitton |
| 7,689,340 B2 | 3/2010 | Schweizer |
| 7,735,618 B2 | 6/2010 | Homm et al. |
| 7,740,558 B2 | 6/2010 | Matsumura et al. |
| 7,752,936 B2 | 7/2010 | Kobayashi et al. |
| 7,757,831 B2 | 7/2010 | Stehr et al. |
| 7,766,139 B2 | 8/2010 | De Maziere et al. |
| 7,775,338 B2 | 8/2010 | Yoshida et al. |
| 7,845,247 B2 | 12/2010 | Olds et al. |
| 7,891,263 B2 | 2/2011 | Mowbray et al. |
| 7,962,267 B2 | 6/2011 | Honma et al. |
| 7,971,697 B2 | 7/2011 | Kemmner et al. |
| 8,129,984 B2 | 3/2012 | Hosek et al. |
| 2004/0007055 A1 | 1/2004 | Kralik et al. |
| 2005/0031140 A1* | 2/2005 | Browning ............ H04R 29/003 381/96 |
| 2005/0067251 A1 | 3/2005 | Braford, Jr. et al. |
| 2005/0101432 A1 | 5/2005 | Pels et al. |
| 2007/0096729 A1* | 5/2007 | Brunson ............ G01R 33/022 324/244 |
| 2007/0142171 A1 | 6/2007 | Jiang |
| 2007/0188164 A1 | 8/2007 | Hodin et al. |
| 2007/0194781 A1* | 8/2007 | Zhitomirskiy ......... G01D 5/204 324/207.17 |
| 2007/0220999 A1 | 9/2007 | Hatori et al. |
| 2007/0277635 A1 | 12/2007 | Komori |
| 2008/0223683 A1 | 9/2008 | Grethel |
| 2009/0000897 A1 | 1/2009 | Staudinger et al. |
| 2009/0069992 A1 | 3/2009 | Preisner et al. |
| 2009/0103112 A1 | 4/2009 | Nygaard |
| 2009/0120710 A1 | 5/2009 | Hasegawa et al. |
| 2009/0125201 A1 | 5/2009 | Leibbrandt et al. |
| 2009/0128139 A1 | 5/2009 | Drenth et al. |
| 2009/0131218 A1 | 5/2009 | Nedachi et al. |
| 2009/0145253 A1 | 6/2009 | Katakura et al. |
| 2009/0165582 A1 | 7/2009 | Tsunashima et al. |
| 2009/0165584 A1 | 7/2009 | Ishii |
| 2009/0166147 A1 | 7/2009 | Neri et al. |
| 2009/0209383 A1 | 8/2009 | Olson et al. |
| 2009/0264254 A1 | 10/2009 | Jaeggle et al. |
| 2009/0321209 A1 | 12/2009 | Grethel et al. |
| 2010/0042302 A1 | 2/2010 | Fritzer et al. |
| 2010/0099537 A1 | 4/2010 | Maten et al. |
| 2010/0206107 A1 | 8/2010 | Gumpoltsberger et al. |
| 2010/0206108 A1 | 8/2010 | Gumpoltsberger et al. |
| 2010/0218628 A1 | 9/2010 | Gumpolsberger et al. |
| 2010/0261577 A1 | 10/2010 | MacFarlane et al. |
| 2010/0268427 A1 | 10/2010 | Kabrich |
| 2011/0015035 A1 | 1/2011 | Marcigliano et al. |
| 2011/0017015 A1 | 1/2011 | Cimatti et al. |
| 2011/0042177 A1 | 2/2011 | Bauer et al. |
| 2011/0054752 A1 | 3/2011 | Arai |
| 2011/0056315 A1 | 3/2011 | Lundberg et al. |
| 2011/0056317 A1 | 3/2011 | Sato |
| 2011/0094845 A1 | 4/2011 | Hogberg et al. |
| 2011/0114437 A1 | 5/2011 | Noehl |
| 2011/0146444 A1 | 6/2011 | Mohlin et al. |
| 2011/0167957 A1 | 7/2011 | Kato et al. |
| 2011/0180352 A1 | 7/2011 | Kirchner et al. |
| 2011/0190990 A1 | 8/2011 | Nedachi et al. |

* cited by examiner

GEAR ENGAGEMENT MECHANISM FOR TRANSMISSIONS AND RELATED METHODS

RELATED APPLICATIONS

This application claims priority from U.S. Application No. 61/615,007 filed 23 Mar. 2012. For purposes of the United States, this application claims the benefit under 35 U.S.C. §119 of U.S. Application No. 61/615,007 filed 23 Mar. 2012 and entitled GEAR ENGAGEMENT MECHANISM FOR TRANSMISSIONS AND RELATED METHODS which is hereby incorporated herein by reference for all purposes.

TECHNICAL FIELD

This invention relates to power transmissions. The invention relates specifically to actuation mechanisms for engaging gears in power transmissions. Embodiments of the invention provide power transmissions, shift members for use in power transmissions, and methods for shifting gears in power transmissions. Another aspect of the invention provides linear position sensing systems that have application in power transmissions but may also be applied in other contexts.

BACKGROUND

Multi-speed power transmission typically comprise gear sets that may be selectively engaged or disengaged to provide various power transmission paths between an input shaft and an output shaft. Engagement and disengagement of different gear sets may be achieved by operating an actuator to move a member, such as a synchronizer, back and forth between engaged and disengaged positions.

Gear shifting in multi-speed power transmissions in high-load applications can cause damage to driven devices in cases where gear shifts occur suddenly. There is a need for improved gear shifting mechanisms. There is a particular need for such mechanisms that are useful in large capacity transmissions, such as industrial power transmissions, in which larger travels of a shifting member may be required.

The foregoing examples of the related art and limitations related thereto are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One aspect of the invention comprises a position sensing system with a plurality of magnetic field sensors each configured to provide an output signal indicative of a direction of a magnetic field relative to the first magnetic field sensors. The position sensing system also comprises a processor coupled to receive the output signals from the first magnetic field sensors, the processor configured to select a subset of the first magnetic field sensors and based on the output signals of the subset of the first magnetic field sensors, determine a position of a magnet along the path.

In some embodiments the position of the magnet may be determined by triangulation from the output of two of the first magnetic field sensors. The triangulation may be performed according to the relationship (or a mathematical equivalent thereof):

$$x = B\left(\frac{\tan\theta}{\tan\phi + \tan\theta}\right)$$

wherein x is the position of the magnet determined by triangulation, B is a distance between the two of the first magnetic field sensors, $\theta$ is a first angle corresponding to the direction output by a first of the two first magnetic field sensors and $\phi$ is a second angle corresponding to the direction output by a second of the two first magnetic field sensors.

In further embodiments, the first magnetic sensors are magneto resistive sensors and the position sensing system comprises a plurality of second magnetic field sensors comprising Hall effect sensors. The processor is configured to receive output signals from the Hall effect sensors and to select the subset of magneto resistive sensors based on these outputs.

Other aspects of the invention comprise a position sensing mechanism in combination with a transmission, and the position signal indicates a current position of a component of the transmission such as shift fork.

Further aspects of the invention comprise an actuator for a shifter in a transmission comprising a rod and a cylinder having a pair of cylinder heads sealingly and slidingly disposed on the rod. The actuator comprises a piston fixed to the rod within the cylinder and sealed to the cylinder such that the piston divides the interior of the cylinder into first and second fluid chambers on opposite sides of the piston, and a shifter member coupled to the cylinder.

The actuator may comprise first and second valves connected to deliver pressurized fluid to the first and second fluid chambers. It may also comprise a magnet on the shifter member. Some embodiments combine an actuator for a shifter and a position sensing system for sensing the position of the magnet and the shifter member.

Other aspects of the invention comprise a method for sensing a position of a magnet along a path comprising sensing a direction of a magnetic field from the magnet at each of a plurality of locations spaced apart from the path and spaced apart from one another along the path. The method comprises identifying at least a first one of the plurality of locations closest to the magnet, and calculating a position of the magnet along the path based at least in part on the direction of the magnetic field at the first one of the plurality of locations.

In some embodiments, the position is determined by triangulation and according to the relationship (or a mathematical equivalent thereof):

$$x = B\left(\frac{\tan\theta}{\tan\phi + \tan\theta}\right)$$

wherein x is a linear offset of the magnet from a position, B is a distance between the two locations for sensing a magnetic field, $\theta$ is a first angle corresponding to the direction of the magnetic field at a first location and $\phi$ is a second angle corresponding to the direction of the magnetic field at a second location.

Further aspects and example embodiments are illustrated in the accompanying drawings and/or described in the following description.

BRIEF DESCRIPTION OF DRAWINGS

The accompanying drawings depict non-limiting example embodiments of the invention.

DESCRIPTION

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

Figure 1:
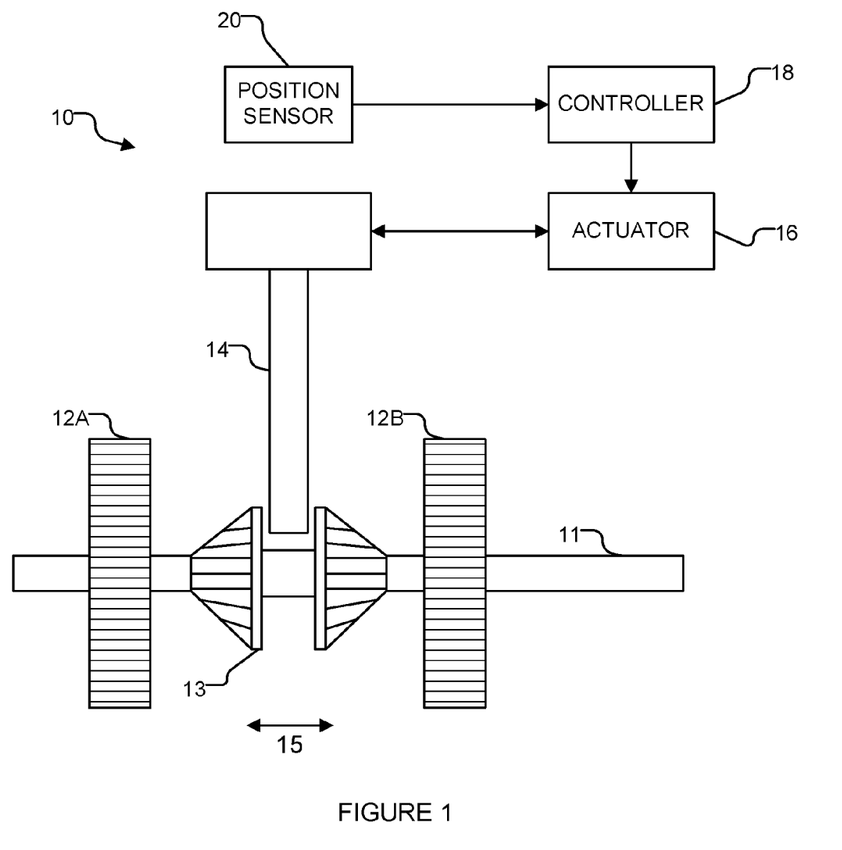
FIG. 1 is a schematic view of an example gear engagement mechanism according to an embodiment of the invention.

FIG. 1 shows a schematic view of an example gear engagement mechanism 10. Mechanism 10 may be part of a power transmission, for example.

A shaft 11 carries gears 12A and 12B. A synchronizer 13 can be slid along shaft 11 in one direction (to the left in FIG. 1) to engage gear 12A and in the opposite direction (to the right in FIG. 1) to engage gear 12B. Synchronizer 13 may, for example, be coupled to rotate with shaft 11 by means of splines (not shown in FIG. 1) or the like. Synchronizer 13, when fully engaged with gear 12A, locks gear 12A to rotate with shaft 11. Synchronizer 13, when fully engaged with gear 12B, locks gear 12B to rotate with shaft 11.

A shifter 14 is moved back and forth in a direction indicated by arrow 15 by an actuator 16 controlled by a controller 18. Controller 18 and shifter 14 cause synchronizer 13 to be moved to a position appropriate for a currently desired configuration of the transmission or other gear train being controlled.

In some applications it is desired to maintain accurate positional control over shifter 14. Maintaining such accurate control may be facilitated by having accurate measurements of the position of shifter 14 in direction 15 by way of a position sensor 20. In some embodiments it is desired to have accurate control over the velocity and/or acceleration of shifter 14. Once again, accurate information regarding the position of shifter 14 can be important in facilitating control over the velocity and/or acceleration of shifter 14 by controller 18.

Figure 2:
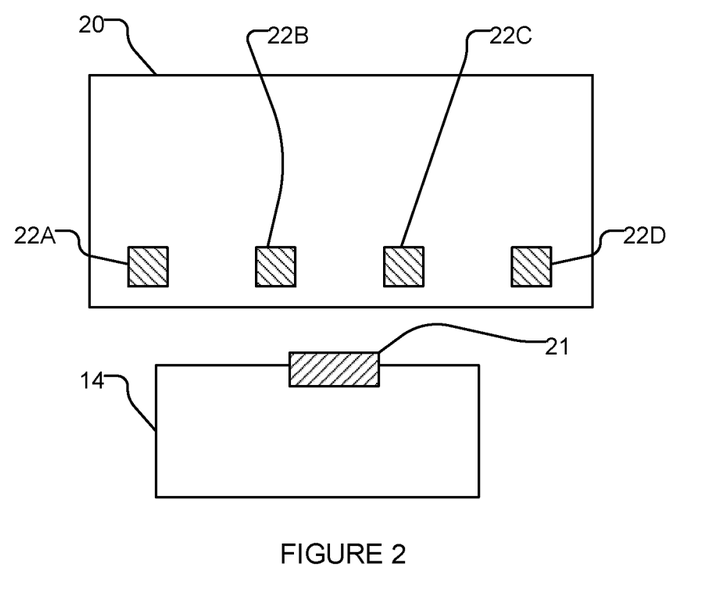
FIG. 2 is schematic view of an example sensor configuration according to an embodiment of the invention.

FIG. 2 illustrates schematically a possible embodiment of sensor 20. Sensor 20 comprises a plurality of magnetic sensors 22A, 22B, 22C, and 22D. The number of magnetic sensors may vary. For example, in some embodiments, there are between three and twenty magnetic sensors 22. This range is not mandatory. Magnetic sensors 22 sense a magnetic field from a magnet 21 which is mounted to move with a portion of shifter 14. Magnet 21 may, for example, comprise a rare earth magnet, an electromagnet or the like.

Magnetic sensors 22 are at known positions and so the position of shifter 14 can be inferred from the signals produced by magnetic sensors 22. Through the use of a linear array of magnetic sensors 22, a position sensor 20 may be provided which can monitor the position of a shifter 14 over a travel of any reasonable length. In an example embodiment, magnetic sensors 22 are spaced apart by distances on the order of 0.2 inches (about ½ cm) to 0.6 inches (about 1½ cm) and monitor the position of a shifter 14 through a travel of, for example, two to five inches (about 5 to 13 cm). In other embodiments, magnetic sensors 22 may be spaced apart by between 0.1 inches (about ¼ cm) or less and 1 inch (about 2½ cm) or more.

The practical range of spacing of magnetic sensors 22 may depend on factors such as the strength of magnet 21, the sensitivity of magnetic sensors 22, the distance between magnet 21 and sensors 22, the positional accuracy required and the like. In some embodiments, sensors 22 are spaced sufficiently closely that for any position of magnet 21 between two adjacent sensors 22, the outputs of the two adjacent sensors 22 each correspond uniquely to a corresponding angle from the sensor 22 to the magnet. In some embodiments, sensors 22 are spaced sufficiently closely that when magnet 21 is between two adjacent sensors 22 the angles between a line connecting the two sensors 22 and a line from each sensor 22 to the magnet 21 are both less than or equal to 45 degrees. In some embodiments the angle between lines from the magnet 21 to two adjacent sensors 22 between which the magnet 21 is located is acute—less than 90 degrees.

Figure 3:
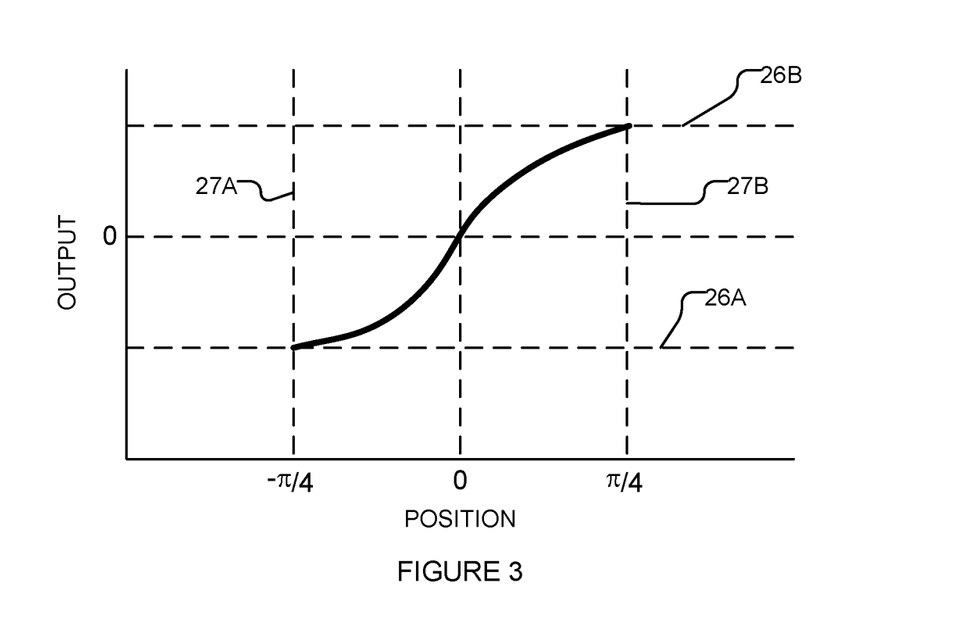
FIG. 3 is a chart of an output of a sensor relative to the position of a magnet according to an example embodiment of the invention.

In an example embodiment, sensors 22 comprise sensors having outputs that are indicative of a direction (e.g. an angle) to magnet 21. For example, magnetic sensors 22 may comprise magneto resistive sensors. FIG. 3 illustrates an output signal of a magneto resistive or other sensor as a function of the relative position of a magnet 21 and the sensor 22. When the sensor 22 is lined up on the axis of magnet 21, as indicated by position zero in FIG. 3, then the output of the sensor has a value of zero (neglecting any offset that may be present in the single signal output by the sensor). Movement of the sensor relative to the magnet results in a signal that varies from a minimum value 26A to a maximum value 26B. Within a range of positions between position 27A and position 27B, the output signal from a sensor 22 is single-valued. The output signal may be viewed as indicating the direction from the sensor 22 to the magnet 21. Magneto resistive sensors typically produce single-valued outputs in a range of angles of approximately 90 degrees (45 degrees to either side of alignment between the sensor 22 and the axis of magnet 21).

Figure 4:
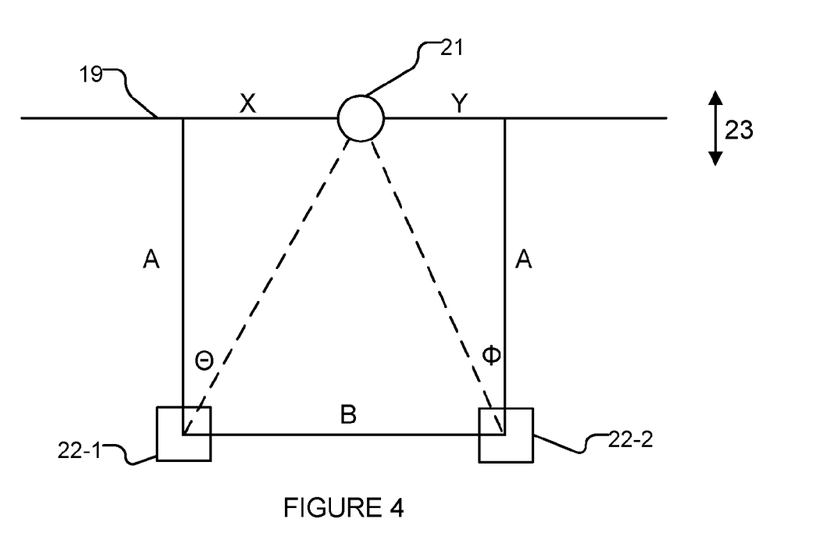
FIG. 4 is a schematic view of example sensors and magnets according to an embodiment of the invention.

As shown in FIG. 4, triangulation based on the outputs of magnetic sensors 22 may be used to identify a precise location for magnet 21 along its path 19 relative to sensors 22 (since magnet 21 is mounted to shifter 14, this is equivalent to determining a precise location of shifter 14). In an example embodiment, the accuracy with which the position of shifter 14 is monitored is within approximately 0.010 inches (0.025 cm) or better. In a preferred embodiment, the accuracy is within approximately 0.005 inches (0.013 cm).

As noted above, the output of a sensor 22 is indicative of an angle from the sensor 22 to magnet 21. If sensors 22 are mounted along a line extending parallel to, and a distance A from the path along which magnet 21 travels when shifter 14 is actuated, then it can be seen that the position of magnet 21 can be determined from the outputs of nearby sensors 22. For example, the distance x (which can be viewed as the linear offset along path 19 from a known sensor position) by which magnet 21 is displaced from sensor 22-1 is given by the equation:

$$x = A \tan \theta \quad (1)$$

Equivalently, the distance y from which magnet 21 is displaced from sensor 22-2 can be determined by the following equation:

$$y = A \tan \phi \quad (2)$$

Therefore, the position of magnet 21 relative to sensors 22 may be determined anywhere in the range of motion of shifter 14 by identifying a closest one of magnetic sensors 22 and using trigonometry according to equation 1 or 2 to determine the position of magnet 21 relative to the sensor. Since the positions of the sensors are known then the position of magnet 21 and hence shifter 14 can be unambiguously determined.

The closest one of magnetic sensors 22 may be determined, for example, by determining the magnetic sensor having the most acute angle θ or φ, corresponding to the smallest distance x or y of the magnet 21 to a sensor 22.

In other embodiments, the angle determined from the output of any one of magnetic sensors 22 in range of magnet 21 may be used to determine the position of magnet 21. In some embodiments outputs or sensors 22 may not be single-valued over the range of possible positions of magnet 21 (i.e. a sensor 22 may produce the same output for two or more different positions of magnet 21). For example, where sensors 22 provide an output that is single-valued only in the range of ±45 degrees sensors 22 at an angle θ, φ greater than 45 degrees may still detect the magnetic field of magnet 21. Assuming that outputs of such sensors always correspond to angles in the range of ±45 degrees could result in an erroneous determination of the position of magnet 21. In such embodiments the angles represented by the outputs of sensors may be disambiguated based on one or more of: the pattern of outputs of some or all of sensors 22 and/or historical outputs of sensors 22 and/or previously determined positions of magnet 21.

In some embodiments, the distance along the line along which magnetic sensors 22 are located and the path 19 along which magnet 21 is moved (along with shifter 14) may not be fixed. For example, in some embodiments, shifter 14 may be free to move slightly in one or more directions (such as directions 23 for example) which may result in the value of A changing over time. A sensor 20 as illustrated in FIG. 2 may be operated in a manner which compensates for variations in A. This may be done by determining the position of magnet 21 using trigonometry from two in-range sensors 22. In some embodiments, the closest two sensors 22 are used (which may, for example, be determined by selecting the sensors 22 with the two smallest angles θ, φ). In other embodiments, angles determined from the outputs of any two sensors 22 within range of magnet 21 may be used to triangulate the position of magnet 21 relative to known locations of sensors 22.

From the geometry of FIG. 4 it can be seen that the distance B between adjacent sensors 22 is equal to the sum of x and y (it should be noted that in some embodiments there may be intervening sensors 22 between sensors 22-1 and 22-2). Therefore, the value A can be eliminated from consideration by using both of equations 1 and 2 above. It can be shown that x is given by:

$$B\left(\frac{\tan\theta}{\tan\phi + \tan\theta}\right) \quad (3)$$

Figure 5:
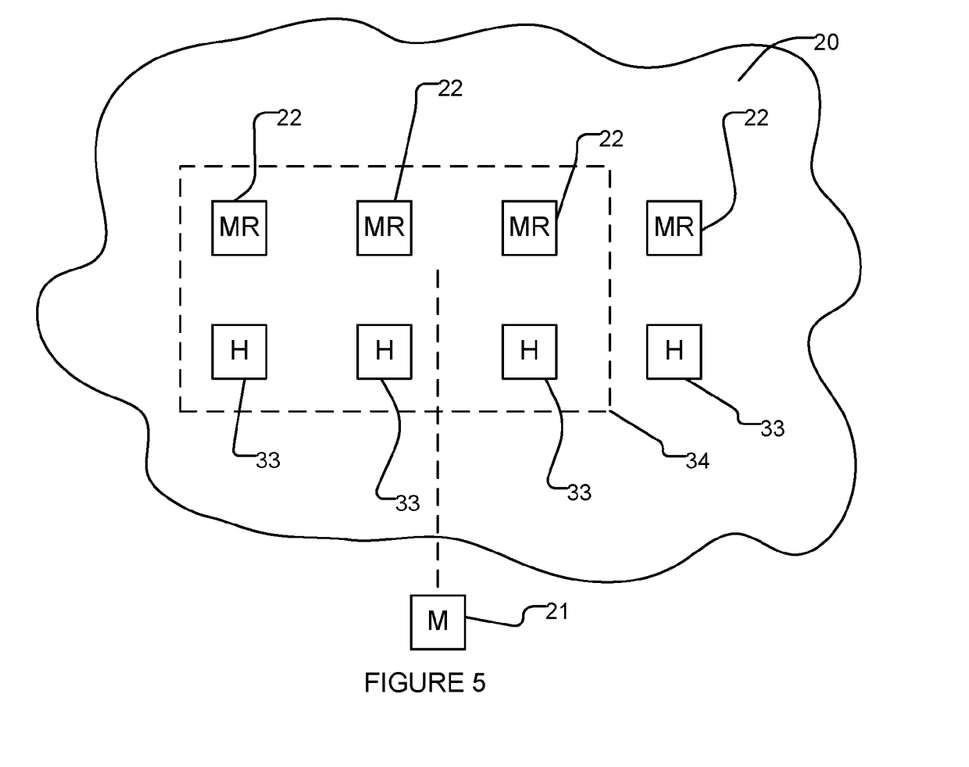
FIG. 5 is schematic view of a portion of a second according to an example embodiment of the invention.

Identifying the nearest magnetic sensors 22 to use for determination of the position of shifter 14 may be based on outputs of sensors 22 themselves. However, since over longer distances the outputs of sensors 22 may not be single-valued, this can sometimes be more complicated than would be desired. In some embodiments, additional sensors are provided to identify which sensors 22 ought to be used for triangulation. FIG. 5 shows an example of a portion of a position sensor 20. In the illustrated embodiment, each sensor 22 is paired with a sensor 33 that responds to or detects the strength of a magnetic field from magnet 21. For example, in some embodiments, sensors 22 comprise magneto resistive sensors and sensors 33 comprise Hall effect sensors.

Sensors 33 may provide outputs that vary with the strength of the applied magnetic field or, in the alternative, sensors 33 may provide binary outputs (e.g., outputs having one state when the detected magnetic field from magnet 21 is high, or above a threshold, indicating that magnet 21 is nearby, and another state when the detected magnetic field is below a threshold, indicating that magnet 21 is farther away). In such embodiments, the outputs from Hall effect sensors 33 may be used to identify a group of magnetic sensors 22 that are closest to the current position of magnet 21. This may be done, for example, by selecting the group of sensors (e.g. two sensors 22) corresponding to the group of Hall effect sensors 33 (e.g. two Hall effect sensors 33) detecting the greatest magnetic field strengths. Outputs from these nearby magnetic sensors may be used to triangulate the position of magnet 21.

In some embodiments, sensors 33 are used to identify two of sensors 22 between which magnet 21 is located. For example, if sensors 33 provide a binary output and two sensors 33 are above the threshold then the two corresponding sensors 22 may be selected. In another example, if a single sensor 33 provides output above the threshold then a corresponding sensor 22 and an adjacent sensor 22, or two sensors 22 adjacent the corresponding sensor 22 may be selected. These two selected sensors 22 may be used to triangulate the position of magnet 21, for example, as described above.

A further advantage that comes from the use of Hall sensors for sensors 33 is that Hall effect sensors may be made to be unidirectional (i.e. only responding to one polarity of the magnetic field). Such sensors can ignore interference from some surrounding magnetic fields.

The output signals of the sensors 22 and/or sensors 33 may be received by a processor (not shown). The processor may be configured to process the output signals as described above to determine the location of magnet 21. The processor may also select a nearest one or nearest set of sensors 22, or identify a set of sensors 22, to use to determine the position of magnet 21 based on the output of sensors 33 as described above.

In some embodiments the range of motion of magnet 21 extends past the location of the last sensor 22 at one or both ends of the row of sensors 22. In such embodiments an angle determined from the output of the last sensor 22 may be used to determined the position of magnet 21 along its path 19 and/or triangulation using outputs of two or more in-range sensors 22 may be applied to determine the position of magnet 21 along its path 19.

Although position sensor 20 has been described in an application for measuring a position of a shifter such as a shift fork in a transmission, a position sensor like 20 may also be applied to measure positions of other transmission components. A position sensor like position sensor 20 may also be applied in other contexts where it is desirable to measure position of a component along an axis. Such sensors may be particularly advantageous in applications where the axis along which the component moves may shift over time. Such sensors may also be particularly advantageous in applications in which the component moves along a path that is not straight.

Figure 6:
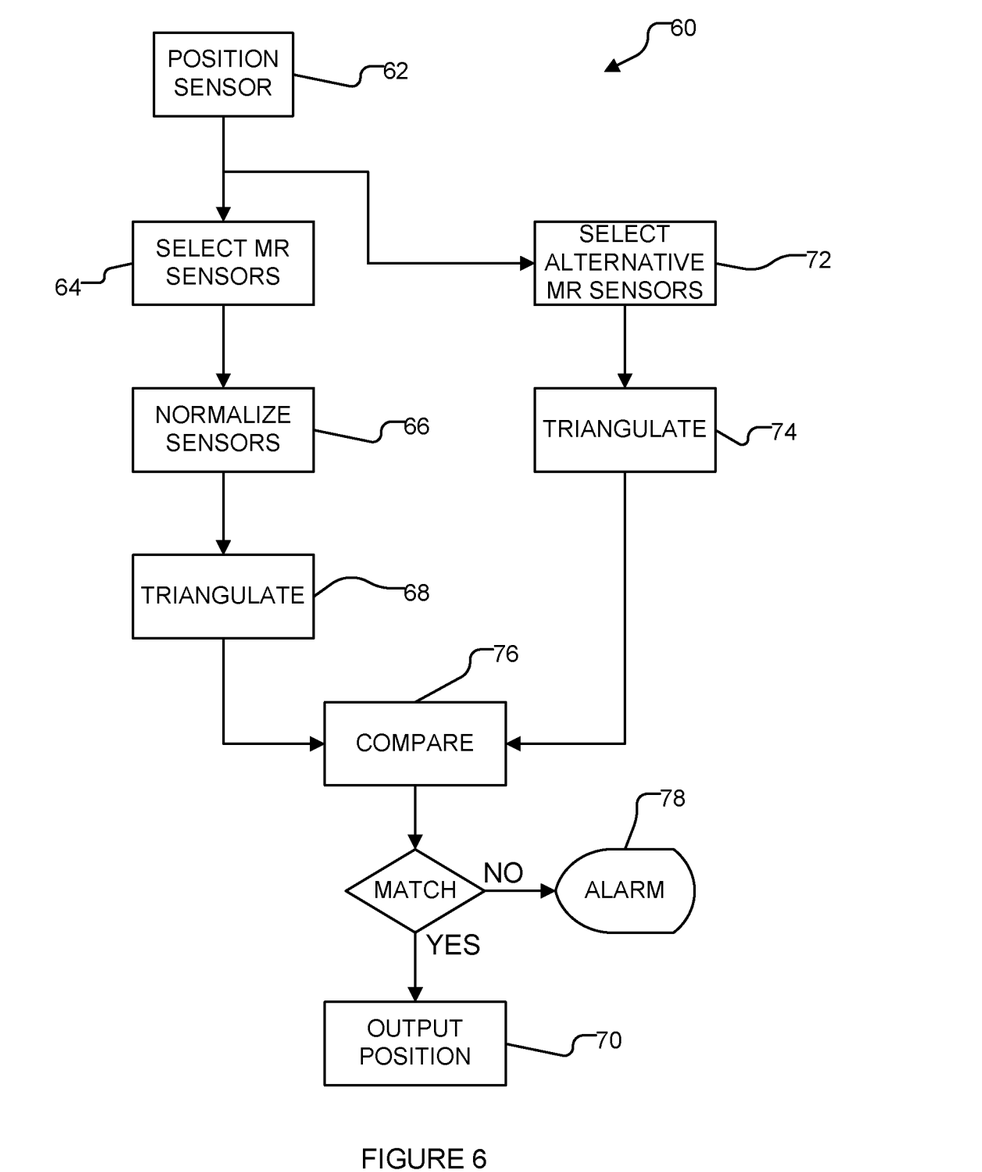
FIG. 6 is a flow chart of a sensing process according to an embodiment of the invention.

FIG. 6 is a flowchart illustrating one example method for determining the location of a shifter 14 which carries magnet 21. In method 60, block 62 reads outputs of sensors 33 and identifies a plurality of sensors 22 that are nearest to the current position of magnet 21. In block 64, a group of nearby sensors 22 is selected. The selection in block 64 is based upon the outputs read in block 62. In block 66 outputs from the selected sensors 22 are read and, if necessary, normalized. Normalization may be applied to compensate for any offset and/or variation in the outputs of different sensors 22. For example, normalization may comprise applying a gain and an offset to the output of each sensor 22. The gain and offset may have been determined by a calibration procedure.

In block 68, the location of magnet 21 may be determined by triangulation. The position may be output in block 70.

Since there are a plurality of sensors 22, the possibility may exist for checking the validity of a position determined by triangulation block 68. In an example embodiment, the location of magnet 21 is determined by triangulation using a different set of sensors 22. For example, the different set of sensors 22 may comprise nearest neighbours of the sensors 22 used for triangulation of block 68.

For example, the alternative sensors are selected in block 72. Triangulation from the outputs of the alternative sensors may be performed in block 74.

The positions resulting from the triangulations in blocks 68 and 74 may be compared at block 76. If the positions match within a desired tolerance then the position determined by block 68 may be output at block 70. Otherwise, an alarm 78 may be provided.

In a further alternative embodiment that may be used separately from or combined with any of the embodiments described above, sensors 22 may be used to compensate for failures of one or more of sensors 33. For example, outputs from one or more sensors 22 near to a sensor 33 may be processed to determine what the output of the sensor 33 ought to be. If the output of the sensor 33 is different from the calculated value then the calculated value may be supplied in place of the output of the sensor 33. That is, the output of sensors 22 may be used to replace a "missing" output of a sensor 33. This procedure may be used to compensate for failures of one or more sensors 33.

Some embodiments use outputs from one or more sensors 22 near to a sensor 33 to verify that Hall effect sensors 33 are functioning properly. For example, the outputs of a group of nearby sensors 22 (e.g. the group may comprise 2, 3, 4, or the like sensors) may be examined to verify the outputs of sensors 33 by checking whether each sensor 22 is outputting a direction of magnet 21 that points towards a particular sensor or sensors 33. One or more of this group of sensors 22 may be too far from magnet 21 to provide an accurate location measurement for magnet 21, but may still provide sufficient directional information to confirm the approximate location of magnet 21 and to check the output of one or more sensors 33 near the magnet 21. In some embodiments, if no outputs of Hall effect sensors 33 are detected or if multiple Hall effect sensors appear to be malfunctioning then position sensing system 20 may signal an error condition or shut down.

In a further alternative embodiment, an alternative position sensing mechanism, which may be a low-accuracy position sensing mechanism, is used to identify the approximate position of shifter 14. The information from the low-accuracy position sensing mechanism may then be used to identify a set of sensors 22 to be used for determining the position of shifter 14. The low accuracy mechanism could comprise, for example, an optical encoder or the like.

Temperatures of components in and around a transmission can vary very significantly depending upon the ambient conditions and also on the amount of heat generated through operation of the transmission itself. The output voltages of position sensors 22 may vary with these temperature changes. Power supply voltages may also be caused to change as a result of temperature changes or other factors. Sensor 20 is preferably designed in such a way that it is relatively insensitive to voltage and/or temperature variations.

In some embodiments, outputs of sensors 22 are sampled by an analog to digital converter (ADC). The ADC may be a stand-alone device or may be integrated with a processor. For example, some single-chip processors have onboard ADCs. In some embodiments, a reference voltage used by the ADC(s) used to measure outputs of sensors 22 is directly tied to the power supply voltage used to power sensors 22. In cases where the output signals from sensors 22 vary directly with the voltage of a power supply supplying power to sensors 22, this construction will result in the measured values of the signals from sensor 22, after being digitized, being insensitive to fluctuations in the power supply voltage. The power supply voltage may be supplied directly both as a reference voltage and as the power supply to sensors 22. In the alternative, the reference voltage may be provided by way of a voltage follower, voltage divider, or other circuit which causes the reference voltage of the ADC(s) to vary with the power supply voltage being delivered to sensors 22.

The triangulation process as described above, for example, also helps to make sensor 20 relatively insensitive to temperature and/or power supply voltage variations. For example, where sensors 22 have the characteristic that temperature and/or power supply voltage variations affect the outputs of sensors 22 by increasing or decreasing the output signal for the same detected angle (or increasing or decreasing the magnitudes of the angles $\theta$, $\phi$ that are determined from the signal outputs for the same position of magnet 21) then the computed position of magnet 21 along its path may be unaffected, at least to first order, by such variations.

Referring to FIG. 4 for example, if the position of magnet 21 along path 19 is determined by triangulation from sensors 22-1 and 22-2 and both sensors 22-1, 22-2 are similarly affected by any temperature and/or power supply voltage changes, then the detected position of magnet 21 (which is based on distance B) will not vary much or at all. If both angles θ and φ are increased (or decreased) slightly due to a temperature or power supply voltage change, then the detected linear offset of magnet 21 along path 19 will change little or not at all.

Figure 7:
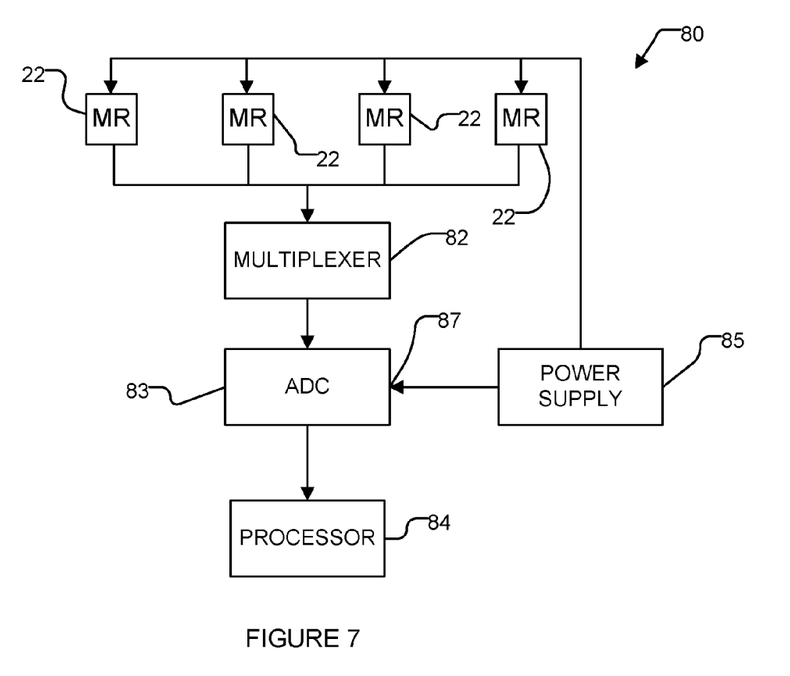
FIG. 7 is a schematic view of a circuit according to an embodiment of the invention.

FIG. 7 shows an example circuit 80 which includes a plurality of sensors 22, and a multiplexer 82, which selects an output from one sensor 22 at a time to provide to an analog to digital converter 83. The output from analog to digital converter 83 is supplied to a processor 84. Processor 84 reads outputs from the sensors 22, and may, for example, execute a method like method 60 to determine the position of a shifter 14 from the values of the signals output by sensors 22. In the illustrated embodiment, a power supply 85 supplies power to sensors 22 and also is connected to a reference voltage input 87 of analog to digital converter 85. In other embodiments multiple ADCs may be provided. Each ADC may be connected such that its reference voltage is provided by the power supply voltage.

The position of shifter 14 is determined with a frequency suitable for the control mechanism being applied and the desired velocities of shifter 14. In an example embodiment, the position of magnet 21 is determined at a rate of several Hertz to several hundred Hertz. This sampling rate is sufficient in many cases. Higher sampling rates could also be used.

Figure 8:
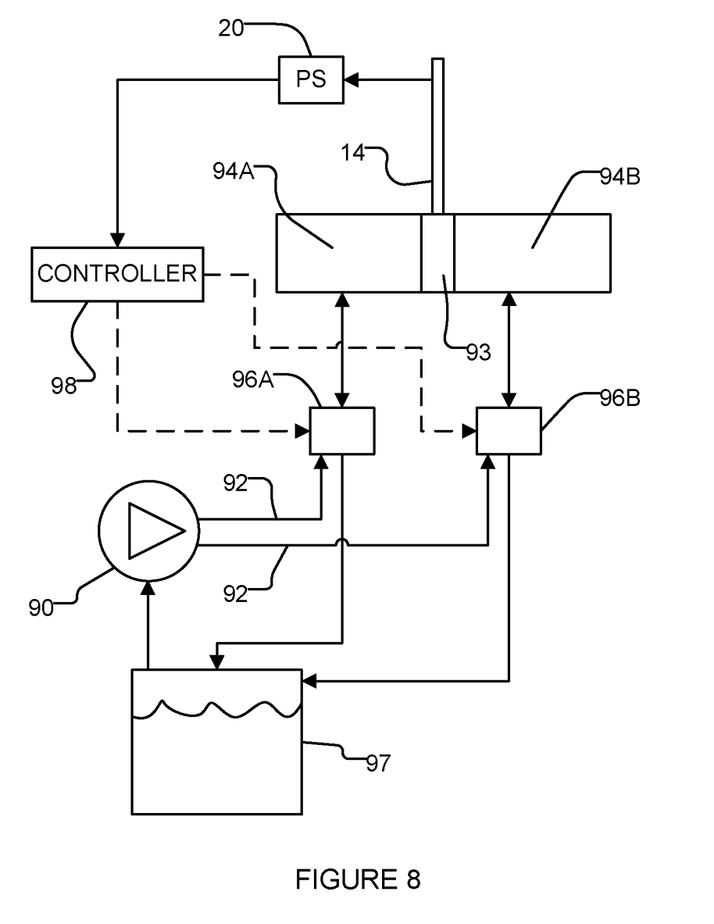
FIG. 8 is a schematic view of a hydraulic control system according to an example embodiment of the invention.

FIG. 8 illustrates an example case in which a position of shifter 14 is controlled hydraulically. In this embodiment, shifter 14 comprises a shift fork 14. In the illustrated embodiment, a hydraulic pump 90 has an output 92 at which pressurized hydraulic fluid is supplied. Shift fork 14 is actuated by a piston 93. Chambers 94A and 94B on either side of piston 93 are coupled to hydraulic pump 90 by way of valves 96A and 96B. Each valve 96A and 96B is electronically controlled and is able to couple the corresponding chamber either to the output 92 of hydraulic pump 90 or to a hydraulic reservoir 97. In some embodiments, valves 96A, 96B are proportional control valves which operate to maintain a set output pressure based on an electrical control signal. A controller 98 may control valves 96A, 96B to move piston 93 in one direction or the other, as desired, to actuate shift fork 14. Controller 98 may also receive position information from position sensor 20 to provide feedback on the position of shift fork 14.

Figure 9:
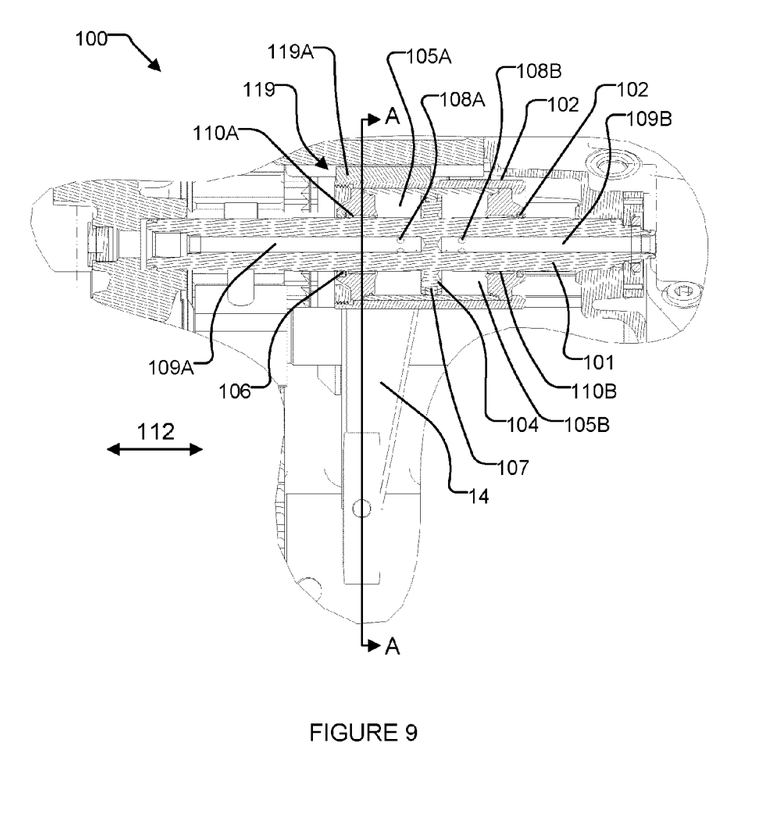
FIG. 9 is a partial cross-section view of a driving mechanism of a shift fork according to an embodiment of the invention.
Figure 9A:
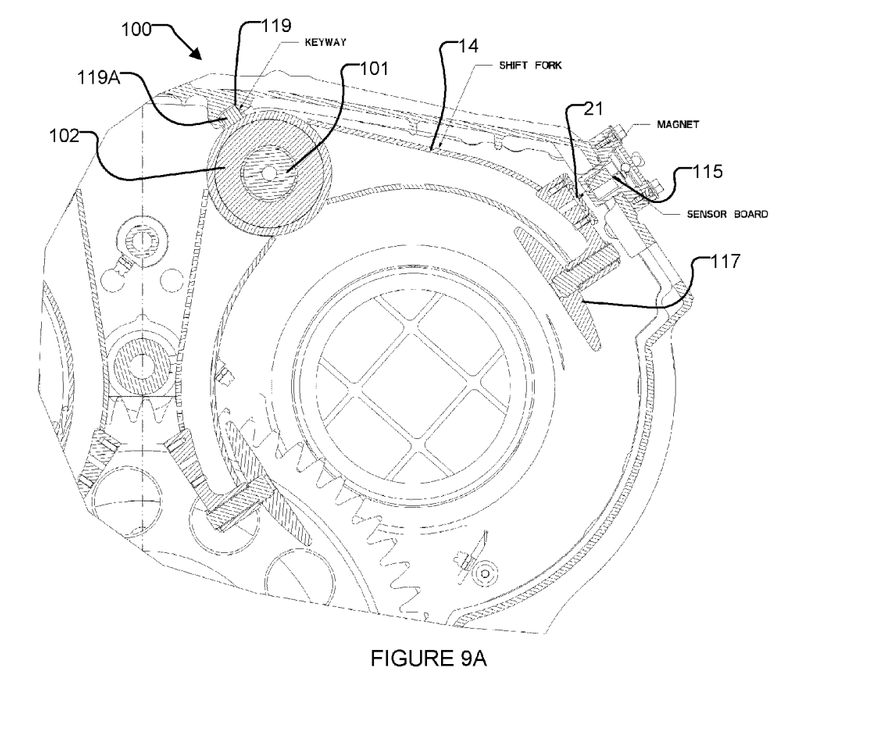
FIG. 9A is a partial cross-section view along lines A-A of FIG. 9 according to an embodiment of the invention.

FIGS. 9 and 9A illustrate an alternative design for a driving mechanism 100 for a shifter (embodied in FIG. 9A by shift fork 14). In this embodiment, the driving mechanism comprises a fixed rod 101. A cylinder 102 is slidably disposed on rod 101. Rod 101 carries a flange or piston 104. In the illustrated embodiment, piston 104 is circumferentially disposed around rod 101. Piston 104 divides the space inside cylinder 102 into two chambers 105A and 105B. Seals 106 at the ends of chambers 105A and 105B prevent the egress of fluid from the ends of the chambers. A seal 107 on piston 104 prevents fluid from directly flowing between chambers 105A and 105B. For example, seal 107 may substantially isolate chambers 105A, 105B from fluid flow through piston 104. Control fluid may be forced into or allowed to flow out of chambers 105A and 105B by way of longitudinal fluid passages 109A and 109B in fixed rod 101 and radial fluid passages 108A, 108B which connect the channels 109A and 109B with the corresponding chambers 105A and 105B. Shift fork 14 is mounted to cylinder 102. By introducing fluid into chamber 105A and removing fluid from chamber 105B or vice versa, shift fork 14 can be made to move back and forth as indicated by arrow 112. The illustrated design provides a relatively compact actuator for shift fork 14 which can nevertheless be sufficiently robust for heavy-duty applications.

Mechanism 100 may also have wear bands 110 adjacent to chambers 105A, 105B. When cylinder 102 nears the end of its stroke on either side (e.g. the left in FIG. 9) on stationary rod 101, wear band 110B is moved over radial passage 108B. As a result, wear band 110B provides a cushion to slow down the motion of shift fork 14 near the end of its range of travel (e.g. by restricting the egress of control fluid from chamber 105B). Additional passages comprising orifices or metering valves may extend between channels 109 and the corresponding chambers 105. Openings to such additional passages in chambers 105 may be provided in or close to piston 104 (e.g. between passages 108 and piston 104) to allow shift fork 14 to be moved through a full stroke even where wear bands 110A, 110B completely block radial passages 108.

The control fluid may be forced into and allowed to flow out of chambers 105A, 105B by one or more pumps (not shown in FIG. 9), such as those known in the art. The one or more pumps may be controlled by a controller such as an electrical or electronic or programmable controller, for example.

FIG. 9A is a cross section on the line A-A of FIG. 9 illustrating a possible position at which a magnet 21 may be located for the purpose of monitoring the position of shift fork 14. FIG. 9A also shows a sensor board 115 which may carry sensors 22, for example, as described above. It can be appreciated that shift fork 14 may rotate slightly around rod 101 during operation and this will vary the distance between magnet 21 and sensor board 115. Similarly, deflection in the arm of shift fork 14 may cause a variation in the distance between magnet 21 and sensor board 115.

FIG. 9A shows slider blocks 117 which engage a synchronizer or other component that is moved to shift gears. FIGS. 9, 9A also show keyway 119 which receives a key 119A on shifter 14. Key 119A can slide back and forth along keyway 119 but reduces or prevents shift fork 14 from rotating around rod 101 Other suitable locking mechanisms may be provided to limit rotation of cylinder 102 about rod 101. The interaction of key 119A and keyway 119 may also reduce the wear on slider blocks 117 by reducing contact or rubbing between slider blocks 117 and the synchronizers or a gear shaft of the transmission (not explicitly shown).

In some embodiments, stationary rod 101 may be a structural member of the transmission as it is unnecessary for stationary rod 101 to move or rotate. In such embodiments rod 101 may be anchored at each end to a structural component of the transmission. When stationary rod 101 acts as a structural member it provides another load path within the transmission, reducing the loading requirements on other components and allowing for reduced weight. Stationary rod 101 may, for example, resist axial forces acting between structures to which rod 101 is anchored. Such axial forces may arise for example as a result of preload and operational forces on tapered bearings and/or the interaction of helical gears or the like.

Hydraulic actuation of a shifter 14 has the advantage that control of the force applied by shifter 14, the velocity of shifter 14, and/or the acceleration of shifter 14 is facilitated. In some embodiments pressure in chambers 105A and 105B are monitored by pressure sensors (not shown) and feedback from the pressure sensors is applied in the control of valves 96 (see FIG. 8).

Figure 10:
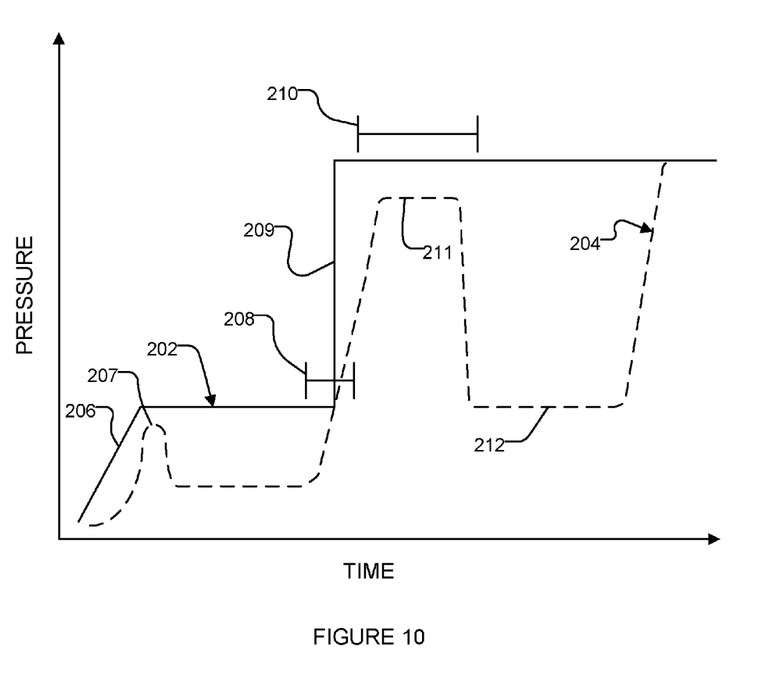
FIG. 10 is a chart of pressure over time during a shift event according to an example embodiment of the invention.

FIG. 10 is an example graph of hydraulic pressure as a function of time for a shift sequence of shift fork 14. The graph illustrates a command signal 202 and a shift fork pressure response 204. An initial command 206 is initiated to move shift fork 14 from a neutral position. The response 204 increases and peaks at peak 207 when the shift fork 14 begins to move. The response 204 dips while the shift fork 14 is moving and begins to increase again as slider blocks 117 (on shift fork 14) make contact with a synchronizer during slider block event 208. The increase in the response due to contact with slider block 117 is followed by an increase 209 in the command signal 202 to further increase the shift fork pressure to initiate a synchronization event 210. The response 204 continues to increase in pressure until reaching a plateau 211 during the synchronization event 210. The response 204 then drops again during displacement of the shift fork 14 (and the synchronizer) into a gear's splines at trough 212. As the shift fork 14 reaches full engagement with a gear, the response 204 rises again to match the command signal 202 and the shift event is complete.

Mechanism 100 comprising cylinder 102 provides a compact actuator that may be applied to move any of various transmission components. For example, cylinder 102 may be coupled to move a gear, synchronizer, clutch or the like. Any suitable mechanical linkage may be provided between cylinder 102 and a component actuated by cylinder 102. Cylinder 102 may be controlled to move a component to effect a gear shift or a step in making a gear shift and in such embodiments cylinder 102 may be referred to as a shifter (while in other embodiments a shifter may refer to, for example, shift fork 14). While a mechanism comprising cylinder 102 may be applied to move a synchronizer or gear, for example by way of a linkage comprising a shift fork, the application of cylinder 102 is not limited to this context.

In some embodiments, the pump(s) and cylinder 102 may be controlled by a controller based on the position of, for example, shift fork 14 determined by sensor board 115 as described above. For example, if shift fork 14 is in a first position with no gear engaged and the transmission is to engage a first gear, the controller may direct the pump(s) to fill a chamber 105A with fluid and drain some fluid from chamber 105B such that cylinder 102 is moved to a second position detected by sensors 22, which may result in the engagement of the first gear. If the transmission is then to be shifted to a neutral gear, the controller may direct the pump(s) to introduce fluid into chamber 105B and drain some fluid from chamber 105A such that cylinder 102 and shift fork 14 are moved back to the first position, as detected by sensors 20 of sensor board 115. In another example, the first position may correspond to engagement with a first gear and the second position may correspond to engagement with a second gear.

In some embodiments the shift fork has a neutral position between two engaged positions. A detent may optionally be provided to assist in holding the shift fork in the neutral position. A detent is not mandatory. In some embodiments position feedback from the position controller is used to actively control the shift fork to remain in the neutral position until it is desired to move the shift fork into an engaged position.

In some example embodiments, a transmission comprises several synchronizers, shift forks and/or other movable components for implementing ratio changes. The transmission may, for example, be a constant-mesh synchromesh dual-clutch transmission. Each of the synchronizers may be actuated by a corresponding mechanism 100. Operation of the actuator mechanisms 100 may be coordinated by a central controller. The controller may comprise an electrical or electronic or programmable controller, for example, which may control mechanisms 100 electrically. A single controller may control positions of all shifting forks in the transmission and may facilitate shifting between one gear and another as required for operational purposes.

Gear engagement mechanisms as described herein can be advantageous in high power applications (e.g. transmissions involving transfer of power in excess of 1800 horsepower), though such gear engagement mechanisms are not limited thereto. One advantage is that a gear engagement mechanism as described herein may be controlled to provide smooth transfer of torque throughout a gear shift. This may be assisted by accurate position information determined by a position sensor and/or method as described herein for example. This smooth gear transfer, in turn, can reduce damage to pumps or other driven elements resulting from shock as gears are changed suddenly. In a dual-clutch transmission having a gear engagement mechanism as described herein, one or both clutches may be allowed to slip in a controlled manner to achieve smooth upshifts that do not expose driven components to excessive shock.

Interpretation Of Terms

Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

In addition, where elements such as steps, acts, processes or blocks of a method may presented in a given order, alternative examples may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times or in different sequences.

Where a component (e.g. a gear, bearing, shaft, assembly, clutch, device, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Specific examples of systems, methods and apparatus have been described herein for purposes of illustration. These are only examples. The technology provided herein can be applied to systems other than the example systems described above. Many alterations, modifications, additions, omissions and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

It is therefore intended that the following appended claims and claims hereafter introduced are interpreted to include all such modifications, permutations, additions, omissions and sub-combinations as may reasonably be inferred. The scope of the claims should not be limited by the preferred embodiments set forth in the examples, but should be given the broadest interpretation consistent with the description as a whole.

What is claimed is:

1. A position sensing system comprising:
  a plurality of first magnetic field sensors arranged in a row adjacent to a path, the first magnetic field sensors each configured to provide an output signal indicative of a direction of a magnetic field relative to the first magnetic field sensors; and
  a processor coupled to receive the output signals from the first magnetic field sensors, the processor configured to:
    select a subset of the first magnetic field sensors; and
    based on the output signals of the subset of the first magnetic field sensors, determine a position of a magnet along the path.

2. A position sensing system according to claim 1 wherein the subset comprises two of the first magnetic field sensors and the processor is configured to determine the position of the magnet by triangulation.

3. A position sensing system according to claim 2 wherein the two first magnetic field sensors are selected such that a location of the magnet on the path lies between first and second planes perpendicular to the path that respectively include a first of the two first magnetic field sensors and a second of the two first magnetic field sensors.

4. A position sensing system according to claim 2 wherein the processor is configured to perform the triangulation according to the relationship:

$$x = B\left(\frac{\tan\theta}{\tan\phi + \tan\theta}\right)$$

or a mathematical equivalent thereof wherein: x is the position determined by triangulation, B is a distance between the two of the first magnetic field sensors, θ is a first angle corresponding to the direction output by a first of the two first magnetic field sensors and φ is a second angle corresponding to the direction output by a second of the two first magnetic field sensors.

5. A position sensing system according to claim 1 wherein the first magnetic field sensors comprise magnetoresistive sensors.

6. A position sensing system according to claim 1 wherein the processor is configured to identify and to include in the subset of the first magnetic field sensors one or more of the sensors that is closest to the magnet.

7. A position sensing system according to claim 6 comprising a plurality of second magnetic field sensors wherein the processor is connected to receive output signals from the second magnetic field sensors and to select the subset of the first magnetic field sensors based on the output signals of the second magnetic field sensors.

8. A position sensing system according to claim 7 wherein the output signals of the second magnetic field sensors indicate whether or not a detected magnetic field has a strength greater than a threshold.

9. A position sensing system according to claim 8 wherein corresponding ones of the first and second magnetic field sensors both lie in one plane extending perpendicular to the path.

10. A position sensing system according to claim 7 wherein the second magnetic field sensors comprise Hall effect sensors.

11. A position sensing system according to claim 1 comprising an analog-to-digital converter connected to digitize the output signals of the first magnetic field sensors, the analog-to-digital converter comprising a reference voltage input, wherein the reference voltage input is directly or indirectly connected to a power supply voltage such that fluctuations in the power supply voltage cause corresponding fluctuations in the reference voltage.

12. A position sensing system according to claim 1 wherein the first magnetic field sensors are constructed such that:
  when one of the first magnetic field sensors is in a plane perpendicular to the path at the current location of the magnet, the output signal has a specified value; and
  when the one of the first magnetic field sensors is not in a plane perpendicular to the path at the current location of the magnet, power supply voltage increases cause the output signal to change toward or away from the specified value and power supply voltage decreases cause the output signal to change away from or toward the specified value.

13. A position sensing system according to claim 1 comprising an actuator coupled to the magnet for moving the magnet along the path, wherein the processor is configured to control the actuator based on the calculated position of the magnet.

14. A position sensing system according to claim 13 wherein the magnet is mounted to a shifter in a transmission and the shifter is constrained to move such that the magnet moves along the path as the shifter is moved by the actuator.

15. A position sensing system according to claim 1 in combination with a transmission wherein the position sensing system is arranged to determine a position of a component of the transmission and to provide a position signal indicating a current position of the component to a transmission controller.

16. A combination according to claim 15 wherein the component comprises a shifter, and the shifter comprises a shift fork coupled to move a synchronizer along a shaft.

17. A combination according to claim 16 wherein the transmission controller is configured to control motion of the shift fork in response to feedback from the position sensor system.

18. A position sensing system according to claim 1 in combination with an actuator for a shifter in a transmission, the actuator comprising:
a rod;
a pair of cylinder heads sealingly and slidably disposed on the rod,
a cylinder extending between the cylinder heads,
a piston fixed to the rod within the cylinder, the piston sealed to the cylinder such that the piston divides the interior of the cylinder into first and second fluid chambers on opposite sides of the piston, and
a shifter member coupled to the cylinder wherein the magnet is mounted to move with the cylinder.

19. A position sensing system combination according to claim 18 comprising first and second passages extending longitudinally in the rod, the first and second passages respectively in fluid communication with the first and second fluid chambers.

20. A position sensing system combination according to claim 19 comprising radial passages extending through the rod into the first and second fluid chambers, the radial passages entering the first and second fluid chambers at first openings spaced apart from the piston.

21. A position sensing system combination according to claim 20 comprising wear rings on the cylinder heads, the wear ring on one of the cylinder heads covering the first openings in the corresponding fluid chamber when the cylinder head is displaced toward the piston before the cylinder head can contact the piston.

22. A position sensing system combination according to claim 21 comprising additional fluid passages extending between the first and second passages and the corresponding one of the first and second fluid chambers, the additional fluid passages each comprising an orifice and/or a metering valve and entering the first and second fluid chambers at second openings located toward the piston from the first openings.

23. A position sensing system combination according to claim 18 comprising a guide mechanism that permits sliding movement of the cylinder along the rod but limits rotation of the cylinder about the rod.

24. A method for sensing a position of a magnet along a path, the method comprising:
sensing a direction of a magnetic field from the magnet at each of a plurality of locations spaced apart from the path and spaced apart from one another along the path;
identifying at least a first one of the plurality of locations closest to the magnet; and
calculating a position of the magnet along the path based at least in part on the direction of the magnetic field at the first one of the plurality of locations.

25. A method according to claim 24 wherein sensing the direction of the magnetic field comprises determining an angle between the magnet and a reference line at the first one of the locations.

26. A method according to claim 25 wherein the angle is an acute angle between a first line extending from the magnet to the first one of the locations and a second line parallel to the path.

27. A method according to claim 26 comprising determining a tangent of the angle.

28. A method according to claim 27 wherein calculating a position of the magnet along the path comprises calculating a linear offset from the first one of the locations using the relationship:

$$x = A \tan \theta$$

wherein x is the linear offset, A is a distance between the magnet and the first one of the locations, and $\theta$ is the angle.

29. A method according to claim 25 wherein the angle is a first angle and sensing the direction of the magnetic field comprises determining a second angle between the magnet and the reference line at a second one of the locations.

30. A method according to claim 29 wherein calculating a position of the magnet along the path comprises calculating a linear offset from the first one of the locations using the relationship:

$$x = B\left(\frac{\tan\theta}{\tan\phi + \tan\theta}\right)$$

or a mathematical equivalent thereof wherein: x is the linear offset, B is a distance between the two of the plurality of locations, $\theta$ is the first angle and $\phi$ is the second angle.

31. A method according to claim 24 wherein sensing the direction of the magnetic field at the plurality of locations comprises receiving outputs from a plurality of magnetoresistive sensors respectively located at the plurality of locations.

32. A method according to claim 31 comprising:
powering the magneto resistive sensors with a power supply voltage;
sampling an output of the magneto resistive sensors with an analog to digital converter while providing a reference voltage to a reference input of the analog to digital converter;
wherein the reference voltage is tied to the power supply voltage.

33. A method according to claim 24 wherein the magnet is mounted to a shifter in a transmission and the method comprises controlling a position of the shifter and/or motion of the shifter based at least in part on the position of the magnet.

* * * * *